United States Patent
Campbell et al.

(10) Patent No.: US 7,652,504 B2
(45) Date of Patent: Jan. 26, 2010

(54) LOW LATENCY, POWER-DOWN SAFE LEVEL SHIFTER

(75) Inventors: Brian J. Campbell, Sunnyvale, CA (US); Vincent R. von Kaenel, Palo Alto, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 11/610,236

(22) Filed: Dec. 13, 2006

(65) Prior Publication Data

US 2008/0143417 A1    Jun. 19, 2008

(51) Int. Cl.
*H03K 19/094*    (2006.01)
(52) U.S. Cl. ....................................... 326/68
(58) Field of Classification Search ............ 326/62, 326/63, 68, 82, 83, 86, 87
See application file for complete search history.

(56) References Cited

U.S. PATENT DOCUMENTS

| | | | |
|---|---|---|---|
| 4,879,690 A | 11/1989 | Anami et al. | |
| 5,450,365 A | 9/1995 | Adachi | |
| 6,501,306 B1 | 12/2002 | Kim et al. | |
| 6,920,060 B2 | 7/2005 | Chow et al. | |
| 7,000,214 B2 | 2/2006 | Iadanza et al. | |
| 7,019,559 B2 | 3/2006 | Kouzuma | |
| 7,098,692 B2 | 8/2006 | Joshi et al. | |
| 7,120,061 B2 | 10/2006 | Daga | |
| 7,245,532 B2 | 7/2007 | Jyouno et al. | |
| 7,355,905 B2 | 4/2008 | Campbell et al. | |
| 7,474,571 B2 | 1/2009 | Campbell | |
| 2001/0008491 A1 | 7/2001 | Sumimoto | |
| 2004/0232944 A1* | 11/2004 | Bu et al. | 326/68 |
| 2005/0237099 A1* | 10/2005 | Tachibana et al. | 327/333 |

OTHER PUBLICATIONS

P.A. Semi, "The PWRficient Processor Family," Jan. 2006, pp. 1-31.
U.S. Appl. No. 11/173,565, filed Jul. 1, 2005.
Office Action from U.S. Appl. No. 11/173,565, mailed Sep. 10, 2007.

* cited by examiner

*Primary Examiner*—Rexford N Barnie
*Assistant Examiner*—Thienvu V Tran
(74) *Attorney, Agent, or Firm*—Lawrence J. Merkel; Meyertons, Hood, Kivlin, Kowert & Goetzel, P.C.

(57) ABSTRACT

In one embodiment, an apparatus comprises a circuit supplied by a first supply voltage during use, the circuit having at least a first input signal; and a level shifter supplied by the first supply voltage during use and coupled to provide the first input signal to the circuit. The level shifter is coupled to receive a second input signal sourced from circuitry supplied by a second supply voltage during use, and is configured to generate the first input signal by level shifting the second input signal. Coupled to receive a power control signal indicating, when asserted, that the second supply voltage is to be powered down, the level shifter is configured to assert a predetermined level on the first input signal independent of the second input signal and responsive to an assertion of the power control signal.

10 Claims, 3 Drawing Sheets

LOW LATENCY, POWER-DOWN SAFE LEVEL SHIFTER

BACKGROUND

1. Field of the Invention

This invention is related to the field of integrated circuits and, more particularly, to supplying power to integrated circuits having multiple voltage domains.

2. Description of the Related Art

As the number of transistors included on a single integrated circuit "chip" has increased and as the operating frequency of the integrated circuits has increased, the management of power consumed by an integrated circuit has continued to increase in importance. If power consumption is not managed, meeting the thermal requirements of the integrated circuit (e.g. providing components required to adequately cool the integrated circuit during operation to remain within thermal limits of the integrated circuit) may be overly costly or even infeasible. Additionally, in some applications such as battery powered devices, managing power consumption in an integrated circuit may be key to providing acceptable battery life.

Power consumption in an integrated circuit is related to the supply voltage provided to the integrated circuit. For example, many digital logic circuits represent a binary one and a binary zero as the supply voltage and ground voltage, respectively (or vice versa). As digital logic evaluates during operation, signals frequently transition fully from one voltage to the other. Thus, the power consumed in an integrated circuit is dependent on the magnitude of the supply voltage relative to the ground voltage. Reducing the supply voltage generally leads to reduced power consumption. However, there are limits to the amount by which the supply voltage may be reduced.

Reducing the supply voltage often reduces the performance of the circuits supplied by that supply voltage. If some circuits in the integrated circuit are busy (and thus need to perform at or near peak operation), the supply voltage must generally remain at a relatively high level. One technique to avoid this is to divide the integrated circuit into voltage "domains" that are supplied by separate supply voltages that may be independently adjusted. That is, the supply voltage for circuits in a given voltage domain is the corresponding supply voltage. Thus, some voltages may be reduced (or even powered down completely) while others remain high for full speed operation.

Once voltage domains that may be at different levels are introduced, it is often required to level shift signals from one domain to another to ensure proper operation in the receiving voltage domain. If the supply voltage from the source voltage domain of a level shifter is powered down, all input signals may be reduced to ground voltage, which may result in an inaccurate signal being provided to the receiving voltage domain by the level shifter. Inaccurate operation may result.

SUMMARY

In one embodiment, an apparatus comprises a circuit supplied by a first supply voltage during use, the circuit having at least a first input signal; and a level shifter supplied by the first supply voltage during use and coupled to provide the first input signal to the circuit. The level shifter is coupled to receive a second input signal sourced from circuitry supplied by a second supply voltage during use, and is configured to generate the first input signal by level shifting the second input signal. Coupled to receive a power control signal indicating, when asserted, that the second supply voltage is to be powered down, the level shifter is configured to assert a predetermined level on the first input signal independent of the second input signal and responsive to an assertion of the power control signal.

In an embodiment similar to the above embodiment, a method comprises detecting that the second supply voltage is to be powered down; asserting a power control signal to the level shifter responsive to the detecting; and generating a predetermined level on the first input signal responsive to the asserting and independent of the second control signal, the generating performed by the level shifter.

In another embodiment, a level shifter comprises a first node on which either an output signal of the level shifter or its inverse is provided by the level shifter during use, an input on which an input signal is received by the level shifter during use, shifting circuitry coupled between the input and the first node and supplied by the first supply voltage during use, and a first transistor coupled to the first node and having a gate controlled responsive to a power control signal. The output signal is received by circuitry supplied with a first supply voltage during use, and the input signal is generated by circuitry supplied by a second supply voltage during use. The shifting circuitry is configured to level shift the input signal to generate the signal on the first node. The power control signal is asserted during use to indicate that the second supply voltage is to power down, and the first transistor drives a predetermined voltage on the first node responsive to assertion of the power control signal.

BRIEF DESCRIPTION OF THE DRAWINGS

The following detailed description makes reference to the accompanying drawings, which are now briefly described.

Figure 1:
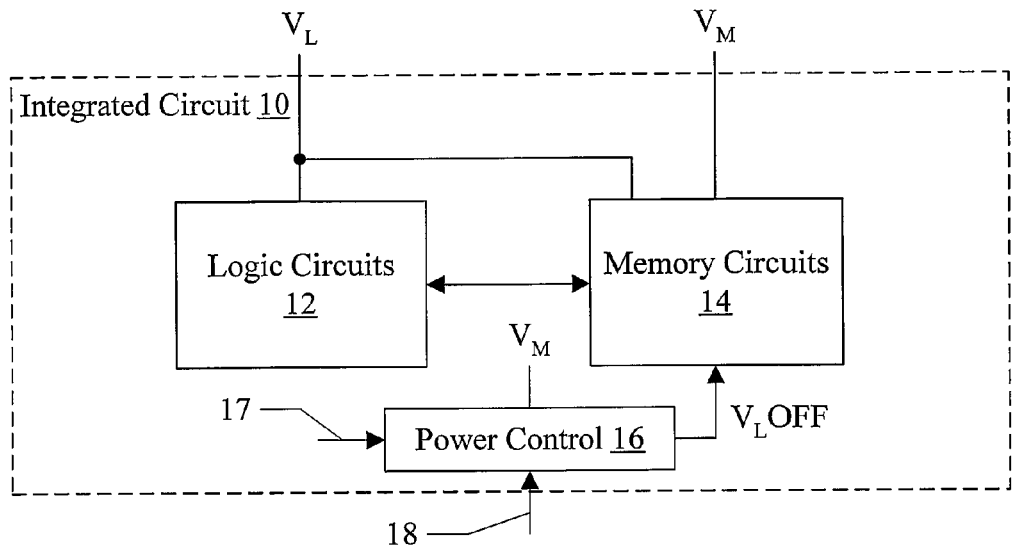
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit 10 is shown. In the illustrated embodiment, the integrated circuit includes a plurality of logic circuits 12, a plurality of memory circuits 14, and a power control circuit 16. The logic circuits 12 are coupled to the memory circuits 14. The power control circuit 16 is coupled to the memory circuits 14 (specifically, via a $V_L$OFF signal). The logic circuits 12 are powered by a first supply voltage provided to the integrated circuit 10 (labeled $V_L$ in FIG. 1). The memory circuits 14 and the power control circuit 16 are powered by a second power supply voltage provided to the integrated circuit 10 (labeled $V_M$ in FIG. 1). In the illustrated embodiment, the memory circuits 14 are also powered by the $V_L$ supply voltage, as will be explained in more detail for certain embodiments below. The integrated circuit 10 may generally comprise the logic circuits 12, the memory circuits 14, and the power control circuit 16 integrated onto a single semiconductor substrate (or chip).

The logic circuits 12 may generally implement the operation for which the integrated circuit is designed. The logic circuits 12 may generate various values during operation, which the logic circuits 12 may store in the memory circuits 14. Additionally, the logic circuits 12 may read various values on which to operate from the memory circuits 14. For example, in various embodiments, the memory circuits 14 may include memory used for caches, register files, integrated-circuit-specific data structures, etc. The memory circuits 14 may implement any type of readable/writeable memory. In an example below, an SRAM memory will be used. It is noted that, while the illustrated embodiment includes a plurality of logic circuits 12 and a plurality of memory circuits 14, various embodiments may include at least one logic circuit 12 and at least one memory circuit 14.

Generally, if a logic circuit 12 is to access a memory circuit 14, the logic circuit 12 may generate various control signals to the memory circuit 14. For example, the control signals may include an address identifying the memory location in the memory circuit 14 that is to be accessed, a read enable signal which may be asserted to perform a read, and a write enable signal which may be asserted to perform a write. For a read, the memory circuit 14 may output data to the logic circuit 12. For a write, the logic circuit 12 may supply data to the memory circuit 14 for storage.

By separating the supply voltage for the logic circuits 12 and the memory circuits 14, the supply voltage for the logic circuits 12 ($V_L$) may be reduced below the level at which the memory circuits 14 may operate robustly. The supply voltage for the memory circuits 14 ($V_M$) may be maintained at the minimum supply voltage that provides for robust memory operation (or greater, if desired). Thus, the $V_L$ supply voltage may be less than the $V_M$ supply voltage during use. At other times, the $V_L$ supply voltage may exceed the $V_M$ supply voltage during use (e.g. at times when higher performance is desired and higher power consumption is acceptable to achieve the higher performance). Alternatively, the $V_M$ supply voltage may be increased to match the $V_L$ supply voltage if the $V_L$ supply voltage would otherwise exceed the $V_M$ supply voltage.

In one embodiment, the $V_L$ supply voltage may even be powered down (that is, reduced to the ground reference) while the $V_M$ supply voltage remains active to retain data in the memory circuits 14. The power control circuit 16 may monitor various inputs (internal, illustrated by arrow 17, and/or external, illustrated by arrow 18) to determine that the $V_L$ supply voltage is to be powered down. In one embodiment, the power control circuit 16 may determine that the $V_L$ supply voltage is to be powered down and may issue a power down request to an external power source such as a voltage regulator (not shown in FIG. 1) that supplies the $V_L$ voltage. In other embodiments, internal or external inputs may indicate that the power down is to occur, and the power control unit 16 may detect the event by monitoring the inputs. In either case, the power control unit 16 may assert the $V_L$OFF signal to the memory circuits 14. The $V_L$OFF signal may be active high (where the asserted state indicating that the $V_L$ voltage is to be powered off is the logical one state) or active low (where the asserted state is the logical zero state). The deasserted state is the opposite of the asserted state in either case. Various level shifters in the memory circuits 14 may use the $V_L$OFF signal to assert a predetermined output to other circuitry in the memory circuits 14, as described in more detail below.

Generally, a supply voltage may be a voltage provided to a circuit to power the circuit, providing the electrical energy to permit the circuit to generate one or more outputs responsive to one or more inputs. At various points herein, supply voltages may be referred to as being greater than or less than other supply voltages. That is, the magnitude of the voltage may be greater than (or less than) the magnitude of the other voltage.

Figure 2:
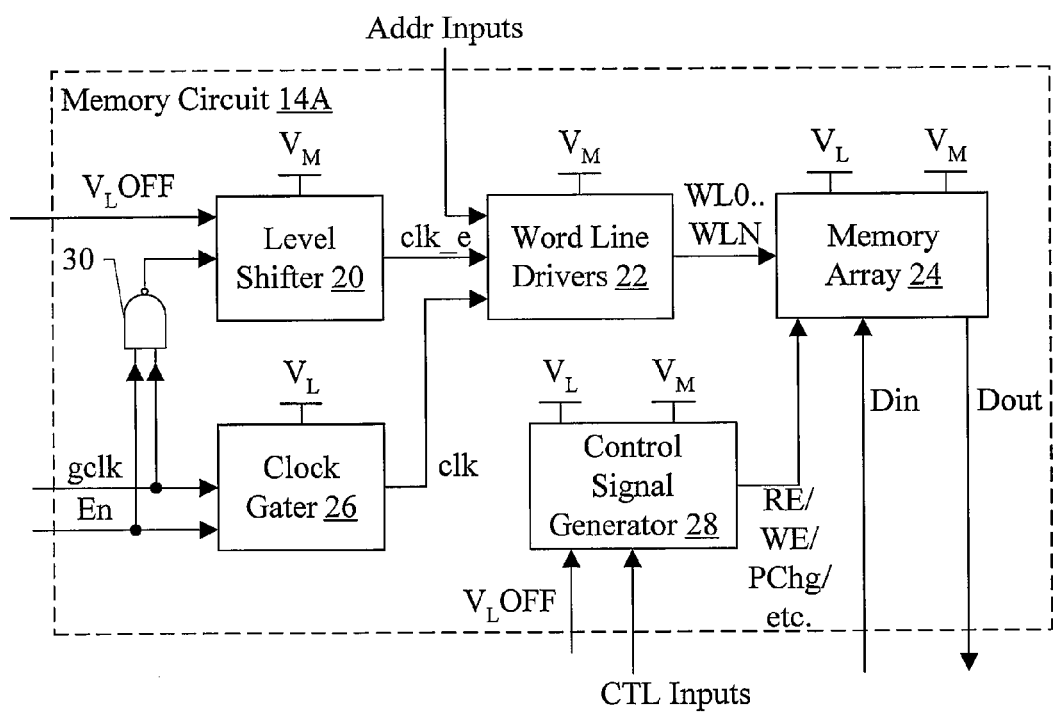
FIG. 2 is a block diagram of one embodiment of a memory circuit shown in FIG. 1.

Turning now to FIG. 2, a block diagram of one embodiment of a memory circuit 14A is shown. The memory circuit 14A may be one of the memory circuits 14. Other memory circuits 14 may be similar. In the embodiment of FIG. 2, the memory circuit 14A includes a level shifter circuit 20, a set of word line driver circuits 22, a memory array 24, a clock gater circuit 26, a control signal generator circuit 28, and a NAND gate 30. The level shifter 20 and the word line drivers 22 are supplied by the $V_M$ supply voltage. The memory array 24 and the control signal generator 28 are supplied by both the $V_M$ and the $V_L$ supply voltages. The clock gater 26 is supplied by the $V_L$ supply voltage. The NAND gate 30 and the clock gater 26 are coupled to receive a clock input (gclk) and one or more enable inputs (En) from the logic circuits 12. The output of the NAND gate 30 (which may be supplied by the $V_L$ supply voltage, not shown in FIG. 2) is coupled as an input to the level shifter 20, which is also coupled to receive the $V_L$OFF signal. The clock gater 26 is configured to generate a clock output (clk) to the word line drivers 22 and the level shifter 20 is also configured to generate a clock output (clk_e) to the word line drivers 22. The word line drivers 22 are further coupled to receive one or more address inputs (Addr inputs) from the logic circuits 12. The word line drivers 22 are configured to generate a set of word lines to the memory array 24 (WL0 . . . WLN). The memory array 24 is further coupled to receive data (Din) and provide data (Dout) to/from the logic circuits 12. Additionally, the memory array 24 is coupled to receive various control signals from the control signal generator 28. For example, the control signals may include a write enable (WE) signal and a read enable (RE) signal. The control signals may also include a precharge (PChg) signal, and any other desired control signals. The control signal generator 28 may generate the control signals for the memory array 24 from corresponding control inputs from the logic circuits 12, and may level shift control signals, in some embodiments. Thus, the control signal generator 28 may receive the $V_L$OFF signal as well and may include one or more level shifters similar to the level shifter 20.

The memory array 24 may comprise a plurality of memory cells that are supplied by the $V_M$ supply voltage. However, the memory circuit 14A is designed to provide for access to the memory array 24 by the logic circuits 12, even if the logic circuits 12 are supplied with a $V_L$ supply voltage that is less than the $V_M$ supply voltage. Each memory cell is activated for access (read or write) by one of the word lines WL0 . . . WLN coupled to that memory cell. One or more memory cells coupled to the same word line form a "word" for access in the memory array 24. That is, the bits of the word may be read/ written as a group. The width of the word may thus be the width of the Din and Dout signals from the memory array 24.

Since the memory cells are supplied by the $V_M$ supply voltage, the word lines may also be supplied by the $V_M$ supply voltage. That is, when a word line is asserted high, the word line may be at approximately a $V_M$ voltage. Thus, the word line drivers 22 are supplied with the $V_M$ supply voltage.

The word line drivers 22 activate a given word line based on address inputs from the logic circuits 12. The address identifies the word in the memory array 24 to be accessed for a given access generated by the logic circuits 12. In some embodiments, the logic circuits 12 may include circuits that partially or fully decode the address, and the address inputs may be the partially or fully decoded address. Alternatively, the word line drivers 22 may implement the full decode function and the address inputs may encode the address. Generally, each different address causes a different word line WL0 to WLN to be asserted.

Since the word line drivers 22 are supplied with the $V_M$ supply voltage, inputs to the word line drivers 22 that are coupled to the gates of p-type metal oxide semiconductor (PMOS) transistors in the word line drivers 22 may be driven to a $V_M$ voltage when driven high (to ensure that the PMOS transistors, which are supplied with a $V_M$ supply voltage, are fully turned off when the gate is driven high). That is, if the gate of the PMOS transistor is driven to a voltage less than the $V_M$ supply voltage on its source, the gate to source voltage of the PMOS transistor is still negative and thus the PMOS transistor may still be active even though it is logically intended to be inactive. If the word line drivers 22 were designed with static complementary MOS (CMOS) circuits, each input would be coupled to the gate of a PMOS transistor and would be driven to a $V_M$ voltage when driven high. In one embodiment, the word line drivers 22 may be implemented with dynamic logic gates. Thus, the clock signal that precharges the circuit (clk_e) is coupled to the gate of a PMOS transistor and may be driven to a $V_M$ voltage. Other signals, coupled to the gates of n-type MOS (NMOS) transistors, may be driven with the $V_L$ voltage. Thus, the address inputs from the logic circuits 12 may be provided directly to the word line drivers 22 (without level shifting). Additionally, the clk signal from the clock gater 26 (supplied with the $V_L$ voltage and thus driven to the $V_L$ voltage when driven high) may be provided directly to the word line drivers 22.

The level shifter 20 is configured to generate the clk_e signal responsive to the gclk signal and the En signal (supplied through the NAND gate 30). If the En signal (or signals) indicate that the clock is enabled for the current clock cycle, the level shifter 20 may generate the clk_e signal by level shifting the input signal such that the high assertion of the clk_e signal is at a $V_M$ voltage.

Additionally, the level shifter 20 may be designed to provide a predetermined voltage level on the output signal (clk_e, in FIG. 2) if the $V_L$ supply voltage is to be powered down, independent of the input signal to the level shifter 20. Since the input signal is generated by circuitry powered by the $V_L$ supply voltage (and thus is powered down), the input signal may be at a ground voltage (or may even float at indeterminate levels). Furthermore, for the embodiments of FIGS. 3 and 4, the inverter 56 may be powered by the $V_L$ supply voltage, and thus the input signal and its inversion are not complements of each other when the $V_L$ supply voltage is powered down. By providing the predetermined voltage level during such time periods, the level shifter 20 may provide predictable behavior for the receiving circuitry. If predicable behavior was not provided, various undesired effects could occur. For example, for the embodiment of FIG. 2 (in which the level shifter provides signals for the memory circuitry), data in the memory could be accidentally overwritten. Or, circuitry that normally is not active at the same time (e.g. bitline prechargers and word line drivers) could be active at the same time and thus cause contention, which could damage the memory circuits and/or cause undesirable power consumption. Still further, when the $V_L$ supply voltage is powered up again, unpredictable logic circuit initializations and/or transitions on the input signals to the level shifter may occur, but the forced value on the output may prevent such unpredictable behavior from reaching the memory circuits. In the present embodiment, the assertion of the $V_L$OFF signal indicates that the $V_L$ supply voltage is to be powered down, and the $V_L$OFF signal may remain asserted while the $V_L$ supply voltage is off, in this embodiment.

The predetermined voltage level may be the level that is considered "safe" for the receiving circuitry. For example, in the case of FIG. 2, the clk_e signal is coupled to the gate of a PMOS transistor in the word line drivers 22, as mentioned above. Accordingly, the safe voltage would be the high ($V_M$) voltage, so that the PMOS transistor is inactive. In other cases, the safe voltage may be the low (ground) voltage, or any other desired voltage level. Various level shifters may implement various predetermined voltage levels, even in the same design, dependent on the safe voltage levels for the receiving circuitry.

Generally, a level shifter circuit may be a circuit configured to level shift an input signal to produce an output signal. Level shifting a signal may refer to changing the high assertion of the signal from one voltage to another. Level shifting may be performed in either direction (e.g. the voltage after level shifting may be higher or lower than the voltage before level shifting). In some embodiments, the low assertion may remain the ground voltage supplied to the integrated circuit 10 (not shown in the figures, often referred to as $V_{SS}$).

The clock gater 26 generates the clk signal responsive to the En signal (or signals) and the gclk signal (similar to the discussion above for the level shifter). If the En signal (or signals) indicate that the clock is enabled for the current clock cycle, the clock gater 26 may generate the clk signal responsive to the gclk signal. If the En signal (or signals) indicate that the clock is disabled, the clock gater 26 may hold the clk signal steady at a low level (ground). In other implementations, the clock gater 26 may hold the clk signal steady at a high level ($V_L$) if the En signal (or signals) indicate that the clock is disabled. In other embodiments, the clock gater 26 may be eliminated and the clk_e signal may be used in place of the clk signal in the word line drivers 22.

In some embodiments, the delay through the level shifter 20 may be approximately the same as the delay through the clock gater 26. In such embodiments, the impact of the level shifter 20 on the critical timing path of the integrated circuit 10 (if any) may be minimized.

As mentioned above, the memory circuit 14A is designed to provide read/write access to the memory array 24 even if the $V_M$ supply voltage is higher than the $V_L$ supply voltage. The level shifter 20 level-shifting input signals and the word line drivers 22 operating at the $V_M$ voltage provide the start of an access. The Din and Dout signals provide the data in (for a write) or the data out (for a read), and thus are in the $V_L$ domain used by the logic circuits 12 in this embodiment. The memory array 24 may also be supplied with the $V_L$ voltage, and may be configured to operate with the Din and Dout signals in the $V_L$ domain. In other embodiments, the Din and Dout signals may be level shifted between the $V_L$ and $V_M$ domains, or only the Din signals may be level shifted and the Dout signals may be in the $V_M$ domain.

In one embodiment, at least the sense amplifier (senseamp) circuits in the memory array 24 that sense the bits read from the memory cells are supplied with the $V_L$ voltage. Thus, the senseamps may also provide a level shift to the $V_L$ domain for the Dout signals. In another embodiment, the senseamp circuits may be supplied with the $V_M$ voltage and the Dout signals may be in the $V_M$ domain. In another implementation, the bit lines coupled to the memory cells to communicate the bits into and out of the memory cells may be in the $V_L$ domain and thus other circuitry that is coupled to the bit lines may be supplied with the $V_L$ supply voltage (except for the memory cells themselves).

As mentioned previously, signals in the $V_L$ domain that are coupled to the gates of PMOS transistors that are supplied by the $V_M$ supply voltage may be level shifted. Thus, in various embodiments, some of the control signals provided to the memory array 24 may be level-shifted. The control signal generator 28 may provide the level shifting, as needed, in various embodiments. If a given control signal is not level shifted, the control signal generator 28 may generate the control signal using circuitry supplied by the $V_L$ supply voltage. If a given control signal is level shifted, the control signal generator 28 may include a level shifter to shift to the $V_M$ domain. The level shifters in the control signal generator 28 may be similar to the level shifter 20 and may respond to an assertion of the $V_L$OFF signal by providing appropriate safe voltages on their outputs.

Figure 3:
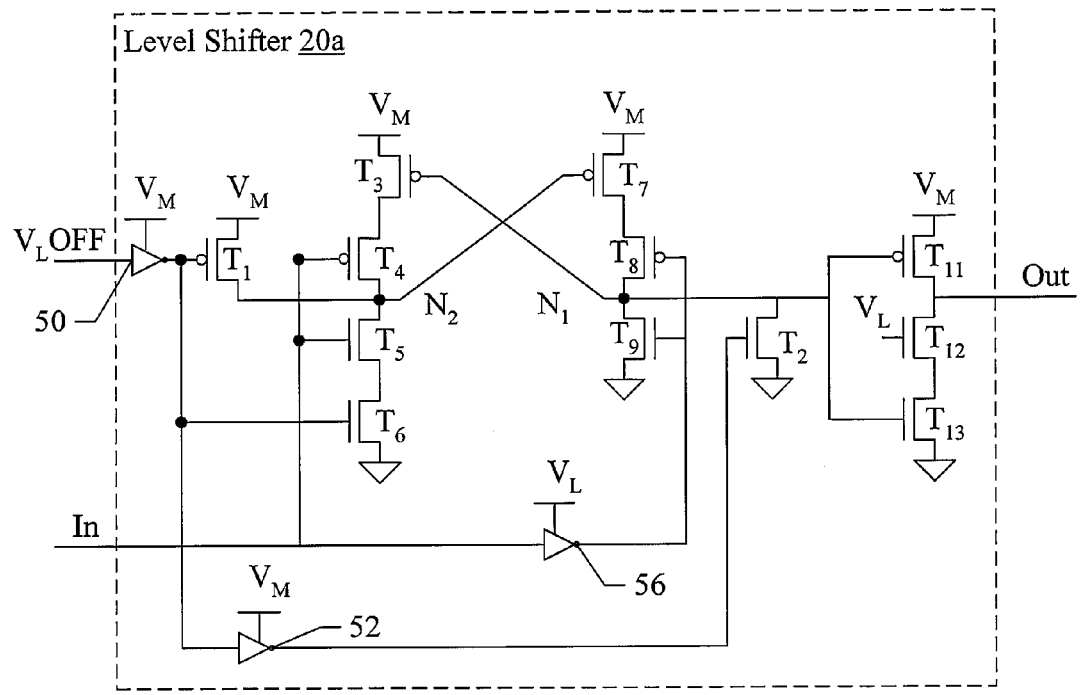
FIG. 3 is a circuit diagram of one embodiment of a level shifter shown in FIG. 2.

Turning now to FIG. 3, a circuit diagram of one embodiment 20a of the level shifter 20 is shown. In the embodiment of FIG. 3, the level shifter 20a includes a shifting stage comprising transistors $T_1$-$T_9$ and an output inverter comprising transistors $T_{11}$-$T_{13}$. $T_3$ has a source coupled to the $V_M$ supply voltage, a gate coupled to a node N1, and a drain coupled to the source of $T_4$. The gates of $T_4$ and $T_5$ are coupled to receive an input signal (In), which may be the output of the NAND gate 30 in FIG. 2. Generally, however, any input signal may be used. The drains of $T_1$, $T_4$, and $T_5$ are coupled to the node N2. The source of $T_5$ is coupled to the drain of $T_6$, and the source of $T_6$ is coupled to ground. The gate of $T_6$ is coupled to an inversion of the $V_L$OFF signal, output from the inverter 50. The output of the inverter 50 and is also coupled to the gate of $T_1$, which has its source coupled to the $V_M$ supply voltage. The In signal is input to an inverter 56 which has its output coupled to the gates of $T_8$ and $T_9$. The source of $T_9$ is coupled to ground. The drains of $T_8$ and $T_9$ are coupled to the node N1. The source of $T_8$ is coupled to the drain of $T_7$, which has its source coupled to the $V_M$ supply voltage. The gate of the transistor $T_7$ is coupled to the node N2. The node N1 is the output of the shift stage and supplies the input to the output inverter. The gates of $T_{11}$, and $T_{13}$ are coupled to the node N1, and the drains of $T_{11}$ and $T_{12}$ are coupled to the output signal (e.g. the clk_e signal in FIG. 2). The source of $T_{11}$ is coupled to the $V_M$ supply voltage. The source of $T_{12}$ is coupled to the drain of $T_{13}$, which has its source coupled to ground. The gate of $T_{12}$ is coupled to the $V_L$ supply voltage. The drain of $T_2$ is coupled to the node N1, and the source of $T_2$ is coupled to ground. The gate of $T_2$ is coupled to the output of an inverter 52, which has its input coupled to the output of the inverter 50.

Operation of the shift stage will first be described. When the input signal (In) transitions from low to high, $T_5$ is activated and begins discharging node N2. $T_4$ is also deactivated by the input signal transition, isolating the node N2 from $T_3$. As the node N2 discharges, $T_7$ activates and begins charging node N1 to the $V_M$ supply voltage ($T_8$ is also activated, and $T_9$ is deactivated, by the transition to low on the output of the inverter 56 due to the transition high of the input signal). Accordingly, N1 results in the same logical state as the input signal, at the $V_M$ supply voltage. When the input signal transitions from high to low, the output of the inverter 56 transitions from low to high and $T_9$ is activated. $T_9$ begins discharging the node N1. $T_8$ is also deactivated by the input signal transition, isolating the node N1 from $T_7$. Thus, the node N1 is discharged to ground. As the node N1 discharges, $T_3$ activates and begins charging node N2 to the $V_M$ supply voltage ($T_4$ is also activated by the transition to low of the input signal), thus deactivating $T_7$.

$T_4$ and $T_8$ may limit power dissipation during transition, by isolating the nodes N2 and N1, respectively, from $T_3$ and $T_7$, respectively. $T_3$ and $T_7$ may be delayed in deactivating with respect to the activation of $T_5$ and $T_9$, respectively, since $T_3$ and $T_7$ are deactivated through the charging of nodes N1 and N2, respectively. By isolating $T_3$ and $T_7$ from their respective nodes N2 and N1 when $T_5$ and $T_9$ are activated, $T_3$ and $T_7$ may be prevented from fighting the discharge of their respective nodes N2 and N1. $T_4$ and $T_8$ are optional and may be deleted in other embodiments. In such embodiments, the drains of $T_3$ and $T_7$ may be coupled to the drains of $T_5$ and $T_9$, respectively.

In this embodiment, the level shifter 20a also provides a forced, predetermined voltage on the output if the $V_L$OFF signal is asserted (high). If the $V_L$OFF signal is asserted, $T_2$ is activated and discharges node N1 to ground. $T_1$ is also activated and charges node N2 to the $V_M$ voltage. This forces a value of ground on node N1 (or a $V_M$ voltage on the output signal). $T_6$ is deactivated, preventing $T_5$ from affecting the node N2. $T_7$ is deactivated as the node N2 charges. Thus, the output node N1 may be held steady at ground if the $V_L$OFF signal is asserted, independent of the state of the input signal. The output signal (Out) may thus be held at the $V_M$ voltage through the inverter formed from transistors $T_{11}$, $T_{12}$, and $T_{13}$. If the $V_L$OFF signal is deasserted (low), $T_6$ is activated via the output of the inverter 50 and thus the shift stage may operate as described above. $T_2$ is deactivated via the output of the inverter 52, and $T_1$ is also inactive. Transistors $T_1$, $T_2$, and $T_6$ establish voltages on the internal nodes N1 and N2 that are consistent with the desired output signal level.

The output inverter provides output buffering, which may permit the transistors $T_1$-$T_9$ to be smaller. The output inverter is optional and may be eliminated in other embodiments. $T_{11}$ and $T_{13}$ provide the inversion. In the illustrated embodiment, the transistors $T_{12}$ is provided to aid in matching the delay of the level shifter 20a to other circuitry supplied by the $V_L$ supply voltage (e.g. the clock gater 26). The transistor $T_{12}$ is optional and may be eliminated in other embodiments that have the inverter formed from transistors $T_{11}$ and $T_{13}$.

The embodiment of FIG. 3 provides a logical one output ($V_M$ voltage on the output signal) if the $V_L$OFF signal is asserted. The embodiment of FIG. 4 is an example of a second embodiment of the level shifter 20 (level shifter 20b) that provides a logical zero output (ground on the output signal).

Figure 4:
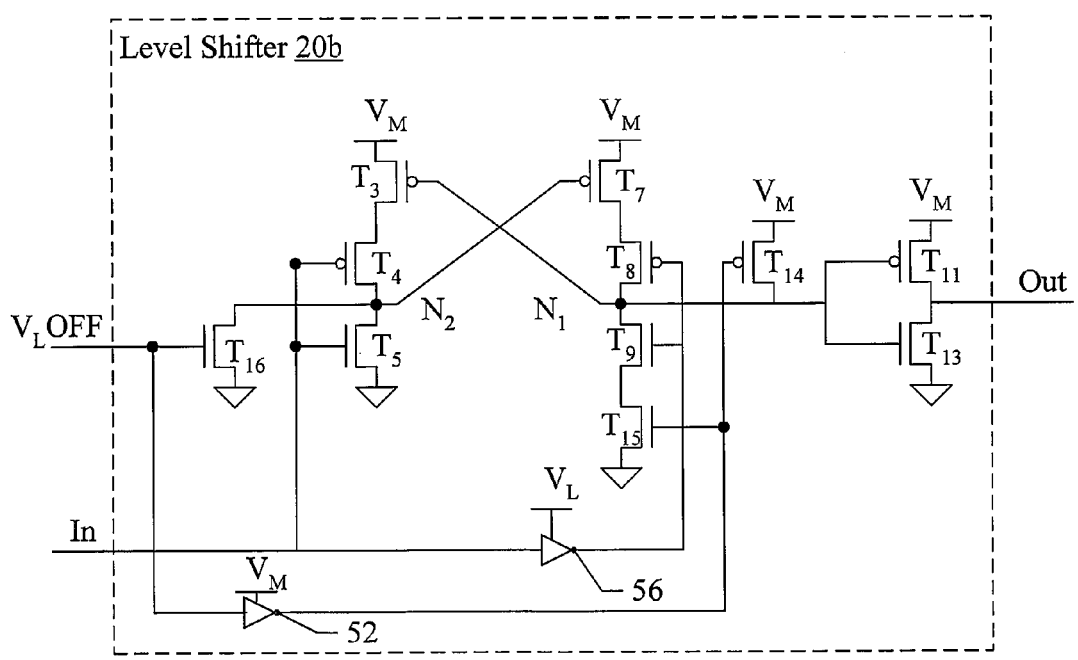
FIG. 4 is a circuit diagram of another embodiment of a level shifter shown in FIG. 2.

The embodiment of FIG. 4 includes a shift stage comprising $T_3$-$T_5$ and $T_7$-$T_9$ and an output inverter comprising $T_{11}$ and $T_{13}$. The transistor $T_{12}$ has been eliminated in this embodiment, since the output signal (Out) is ground when $V_L$ is powered down in this embodiment. In order to drive the ground voltage via $T_{13}$, $T_{12}$ is eliminated. $T_3$-$T_5$, $T_7$-$T_9$, and $T_{10}$-$T_{11}$ and $T_{13}$ are coupled to each other and to the nodes N1 and N2 in a manner similar to the embodiment of FIG. 2 (except that the transistor $T_{12}$ has been removed and thus the drain of $T_{13}$ is coupled to the drain of $T_{11}$). $T_3$-$T_5$, $T_7$-$T_9$, $T_{10}$-$T_{11}$, and $T_{13}$ operate similar to the description of FIG. 3 responsive to the high and low inputs on their gate terminals. Comments regarding portions that are optional may be similar to the description of FIG. 3 as well. However, the source of $T_9$ is coupled to the drain of a transistor $T_{15}$, which has its source coupled to ground and its gate coupled to the output of the inverter 52, which has its input coupled to the $V_L$OFF signal. The gate of a transistor $T_{16}$ is coupled to the $V_L$OFF signal as well, and has its drain coupled to the node N2 and its source coupled to ground. A transistor $T_{14}$ has its drain coupled to the node N1 and its source coupled to the $V_M$ supply voltage. The gate of $T_{14}$ is coupled to the output of the inverter 56. Thus, if the $V_L$OFF signal is asserted (high), the transistor $T_{16}$ discharges the node N2 to ground, and the transistor $T_{14}$ charges the node N1 to the $V_M$ supply voltage (and the transistor $T_{15}$ prevents the transistor $T_9$ from having an effect on the node N1). The output signal is thus a logical zero (ground voltage) in response to assertion of the $V_L$OFF signal, independent of the input signal. Transistors $T_{14}$, $T_{15}$, and $T_{16}$ establish voltages on the internal nodes N1 and N2 that are consistent with the desired output signal level.

It is noted that the transistors in the embodiments of FIGS. 3 and 4 may be PMOS or NMOS transistors, using the standard symbols for such transistors. That is, a transistor with a gate terminal having an open circle (e.g. the transistor $T_1$) is a PMOS and a transistor with a gate terminal having no open circle (e.g. the transistor $T_2$) is an NMOS.

As can be seen in the embodiments of FIGS. 3 and 4, various transistors may have gate terminals coupled to receive the $V_L$OFF signal or its complement (inverse). Accordingly, the transistors may generally be controlled responsive to the $V_L$OFF signal. It is noted that, while various nodes/signals are described as being charged/discharged to a given voltage level, there may be some variation in voltage levels on nodes. Accordingly, a node may generally be charged/discharged (or driven) to approximately the given voltage level.

It is noted that, while logic circuits that may be powered down and memory circuits that may remain powered, with level shifters as described above in between, are shown in this embodiment, other embodiments may be used in other fashions. Generally, there may be source circuitry powered by one supply voltage (that may be powered down) that supplies signals to level shifters and receiving circuitry powered by another supply voltage that receives the level shifted outputs from the level shifters (and that may remain powered when the source circuitry's supply voltage is powered down).

In some embodiments, the level shifter may be configured to receive an enable along with the input signal. For example, the gclk and En signals input to the NAND gate 30 could be incorporated into the level shifter. In such an embodiment, additional transistors may be included. Such transistors may have the enable signal or its complement coupled to the gate terminal and may be placed in parallel or series with the transistors having gate terminals coupled to the input signal or its inversion. Parallel or series coupling is selected to prevent the effect of the input signal if the enable signal is not asserted to indicate enabled.

In some embodiments, an additional NMOS transistor may be coupled in series with the transistor $T_9$ of FIG. 3 or the transistor $T_5$ of FIG. 4, with the gate terminal coupled to the $V_M$ supply voltage, to make the circuit symmetrical. Other embodiments may be asymmetrical, as shown.

Figure 5:
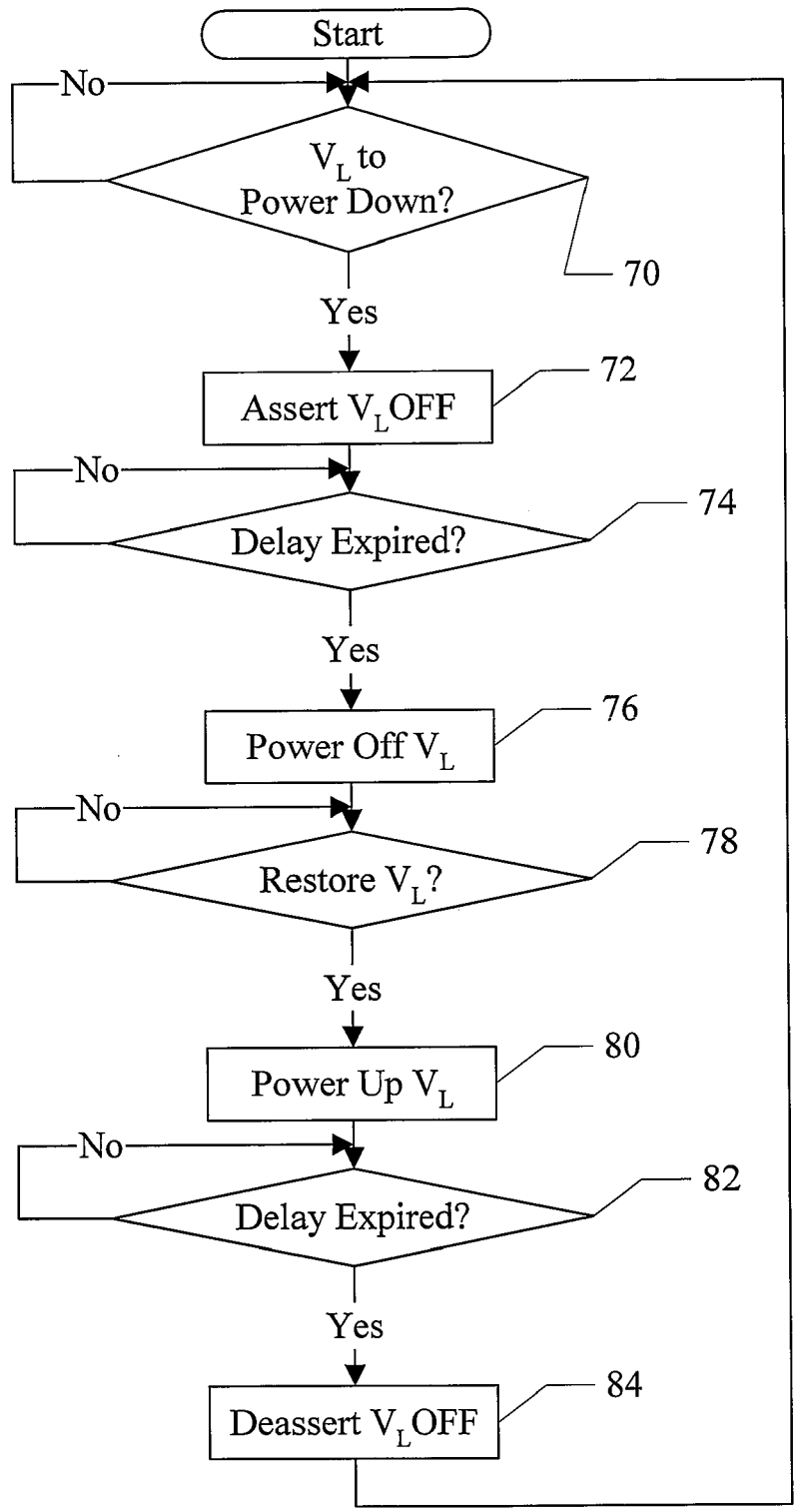
FIG. 5 is a flowchart illustrating one embodiment of a method.

Turning now to FIG. 5, a flowchart is shown illustrating one embodiment of a method for using the $V_L$OFF signal and level shifters as described above to protect receiving circuitry such as the memory circuits when source circuitry has its supply voltage powered down and/or powered up. For example, the method may be implemented by the power control circuit 16 (in conjunction with an external voltage regulator to power the supply voltage up or down, in one embodiment).

The power control circuit 16 may monitor various signals and determine if the $V_L$ supply voltage is to be powered down (decision block 70). If so (decision block 70, "yes" leg), the power control circuit 16 may assert the $V_L$OFF signal (block 72). Optionally, the power control circuit 16 may delay for a period of time to allow the $V_L$OFF signal to propagate and the level shifters to establish their predetermined voltage levels. Once the delay has expired (decision block 74, "yes" leg), the power control circuit 16 may cause the $V_L$ supply voltage to be powered off (block 76). For example, the power control circuit 16 may transmit a request to a voltage regulator or other power circuit that supplies the $V_L$ supply voltage. The $V_L$OFF signal may remain asserted.

At some point, it may be desirable to power the $V_L$ supply voltage back up (or restore the voltage—decision block 78). Similar operation may occur at initial power up of the $V_L$ supply voltage (e.g. when a device containing the integrated circuit 10 is powered on). When the $V_L$ supply voltage is to be restored (decision block 78, "yes" leg), the power control circuit 16 may cause the $V_L$ supply voltage to be powered up (block 80). For example, the power control circuit 16 may transmit a request to the voltage regulator or other power circuit that supplies the $V_L$ supply voltage, as mentioned above. Optionally, the power control circuit 16 may delay for a time period to allow the $V_L$ supply voltage to power up and stabilize, and for the circuitry powered by the $V_L$ supply voltage to initialize. When the delay expires (decision block 82, "yes" leg), the power control circuit may deassert the $V_L$OFF signal (block 84), and the level shifters may begin regular operation.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a circuit supplied by a first supply voltage during use, the circuit having at least a first input signal; and
   a level shifter supplied by the first supply voltage during use and coupled to provide the first input signal to the circuit, wherein the level shifter is coupled to receive a second input signal sourced from circuitry supplied by a second supply voltage during use, and wherein the level shifter is configured to generate the first input signal by level shifting the second input signal;
   wherein the level shifter is further coupled to receive a power control signal indicating, when asserted to a first logic state, that the second supply voltage is to be powered down to a ground reference, and wherein the level shifter is configured to assert a predetermined voltage level on the first input signal independent of the second input signal and responsive to an assertion of the power control signal to the first logic state; and
   wherein the level shifter comprises:
      a node and an internal node;
      a first pullup circuit coupled between the node and a first power supply conductor powered by the first supply voltage during use;
      a first pulldown circuit coupled between the node and ground;
      a second pullup circuit coupled between the internal node and the first power supply conductor;
      a second pulldown circuit coupled between the internal node and ground;
      a transistor coupled to the node, wherein the transistor is controlled responsive to the power control signal and the transistor is configured to establish a first voltage on the node that causes the predetermined voltage level on the first input signal responsive to the assertion of the power control signal to the first logic state; and
      at least one additional transistor coupled to the internal node and controlled responsive to the power control signal, and wherein the additional transistor is configured to establish a second voltage on the internal node responsive to the assertion of the power control signal to the first logic state.

2. The apparatus as recited in claim 1 wherein the transistor is a P-type Metal-Oxide-Semiconductor (PMOS) transistor, and wherein the PMOS transistor is configured to drive the node to approximately the first supply voltage in response to the assertion of the power control signal.

3. The apparatus as recited in claim 1 wherein the transistor is an N-type Metal-Oxide-Semiconductor (NMOS) transistor, and wherein the NMOS transistor is configured to drive the node to approximately a ground voltage in response to the assertion of the power control signal.

4. The apparatus as recited in claim 1 wherein the circuit comprises a memory.

5. A level shifter comprising:
an output on which the level shifter is configured to drive an output signal during use, the output signal received by circuitry supplied with a first supply voltage during use;
an input on which an input signal is received by the level shifter during use, wherein the input signal is generated by circuitry supplied by a second supply voltage during use;
shifting circuitry coupled between the input and the output, wherein the shifting circuitry is supplied by the first supply voltage during use, wherein the shifting circuitry is configured to level shift the input signal to generate the output signal, wherein the shifting circuitry comprises a first node and a second node on which the shifting circuitry is configured to actively generate voltages during shifting operations using pullup and pulldown transistors coupled to the first node and pullup and pulldown transistors coupled to the second node, and wherein the shifting circuitry comprises:

a first transistor coupled to the first node and having a gate controlled responsive to a power control signal, wherein the power control signal is asserted to a first logic state during use to indicate that the second supply voltage is to power down to a ground reference, and wherein the first transistor drives a predetermined voltage level on the first node responsive to assertion of the power control signal to the first logic state; and
at least one second transistor coupled to the second node and having a gate controlled responsive to the power control signal, wherein the second transistor is configured to drive a voltage on the second node responsive to the assertion of the power control signal to the first logic state.

6. The level shifter as recited in claim 5 wherein the first transistor is a P-type Metal-Oxide-Semiconductor (PMOS) transistor, and wherein the PMOS transistor is configured to drive the first node to approximately the first supply voltage.

7. The level shifter as recited in claim 5 wherein the transistor is an N-type Metal-Oxide-Semiconductor (NMOS) transistor, and wherein the NMOS transistor is configured to drive the first node to approximately a ground voltage.

8. The level shifter as recited in claim 5 wherein the second transistor is a P-type Metal-Oxide-Semiconductor (PMOS) transistor.

9. The level shifter as recited in claim 5 wherein the second transistor is a N-type Metal-Oxide-Semiconductor (NMOS) transistor.

10. The level shifter as recited in claim 5 wherein the shifting circuitry comprises two symmetrical series connections of transistors.

* * * * *

UNITED STATES PATENT AND TRADEMARK OFFICE
CERTIFICATE OF CORRECTION

| | |
|---|---|
| PATENT NO. | : 7,652,504 B2 |
| APPLICATION NO. | : 11/610236 |
| DATED | : January 26, 2010 |
| INVENTOR(S) | : Brian J. Campbell et al. |

Page 1 of 1

It is certified that error appears in the above-identified patent and that said Letters Patent is hereby corrected as shown below:

On the title page, item (74), in column 2, in "Attorney, Agent, or Firm", line 2, delete "Kower" and insert -- Kowert --, therefor.

In column 7, line 43, delete "$T_{11}$," and insert -- $T_{11}$ --, therefor.

In column 8, line 56, delete "$T_1 1$)." and insert -- $T_{11}$). --, therefor.

Signed and Sealed this

Fourteenth Day of September, 2010

David J. Kappos
*Director of the United States Patent and Trademark Office*